(12) United States Patent
Fujii et al.

(10) Patent No.: US 8,141,926 B2
(45) Date of Patent: Mar. 27, 2012

(54) ROBOT HAND FOR SUBSTRATE TRANSFER

(75) Inventors: Yoshinori Fujii, Shizuoka (JP); Shinya Nakamura, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 12/863,331

(22) PCT Filed: Feb. 4, 2009

(86) PCT No.: PCT/JP2009/051898
§ 371 (c)(1),
(2), (4) Date: Aug. 30, 2010

(87) PCT Pub. No.: WO2009/099107
PCT Pub. Date: Aug. 13, 2009

(65) Prior Publication Data
US 2011/0049921 A1    Mar. 3, 2011

(30) Foreign Application Priority Data

Feb. 6, 2008    (JP) ................................. 2008-025979

(51) Int. Cl.
*B65G 49/07*    (2006.01)
(52) U.S. Cl. ........................................ 294/213; 414/941
(58) Field of Classification Search .................. 294/213; 414/941, 935
See application file for complete search history.

(56) References Cited

U.S. PATENT DOCUMENTS

| 6,267,423 B1 * | 7/2001 | Marohl et al. ................ 294/213 |
| 7,048,316 B1 * | 5/2006 | Blank et al. .................. 294/213 |
| 2006/0131903 A1 * | 6/2006 | Bonora et al. ................ 294/1.1 |

FOREIGN PATENT DOCUMENTS

| JP | 07-183359 A | 7/1995 |
| JP | 08-055814 A | 2/1996 |
| JP | 9266239 A | 10/1997 |
| JP | 2002-353291 A | 12/2002 |
| JP | 2004-200576 A | 7/2004 |
| TW | 434176 B | 5/2001 |

OTHER PUBLICATIONS

Written Opinion and Search Report from Singapore Patent App. No. 201005284-3 (Nov. 8, 2011).
International Search Report for PCT Patent App. No. PCT/JP2009/051898 (Mar. 3, 2009).

* cited by examiner

*Primary Examiner* — Saul Rodriguez
*Assistant Examiner* — Gabriela Puig
(74) *Attorney, Agent, or Firm* — Cermak Nakajima LLP; Tomoko Nakajima

(57) ABSTRACT

There is provided a robot hand for substrate transfer in which the robot hand is so arranged that, even in case a substrate (S) gives rise to warping, the substrate (S) can be stably supported. On an upper surface of the robot hand there is formed a first seating surface on which is seated a lower-surface peripheral portion of the substrate (S) and, on a periphery thereof, there is formed an upwardly extended step. The step is provided with a plurality of stair-shaped stages. On an upper surface of the robot hand inwardly away from the first seating surface there is provided a second seating surface which is inclined downward toward the center of the substrate (S) such that a lower surface of the substrate (S) is seated on the second seating surface when the substrate (S) is warped downward into a concave shape.

3 Claims, 5 Drawing Sheets

ROBOT HAND FOR SUBSTRATE TRANSFER

This application is a national phase entry under 35 U.S.C. §371 of PCT Patent Application No. PCT/JP2009/051898, filed on Feb. 4, 2009, which claims priority under 35 U.S.C. §119 to Japanese Patent Application No. 2008-025979, filed Feb. 6, 2008, both of which are incorporated by reference.

TECHNICAL FIELD

The present invention relates to a robot hand for substrate transfer in which the robot hand is mounted on a transfer robot for transferring a substrate such as a semiconductor wafer, a glass wafer and the like to support the substrate in a state of being mounted on the robot hand.

BACKGROUND ART

Conventionally, as an apparatus for performing various kinds of processing such as film-forming processing, etching processing and the like on a substrate, there is known a processing apparatus (a so-called cluster tool apparatus) which is constituted as shown in FIG. 1 by arranging a load-lock chamber B for the substrate and a plurality of processing chambers C in a manner to enclose a centrally positioned transfer chamber A having disposed therein a transfer robot 1. The processing apparatus is thus so arranged that a substrate S loaded into the load-lock chamber B can be transferred to the respective processing chambers C by means of the transfer robot 1. The transfer robot 1 is provided with a rotatable and telescopic robot arm 2. On a front end of the robot arm 2 there is mounted a robot hand 3 which supports the substrate S in a state of being placed on the robot hand.

In the course of subjecting the substrate S to various kinds of processing by means of the above-mentioned processing apparatus, there are cases where the substrate S is warped upward into a convex shape or is warped downward into a concave shape due to the difference in the direction of stresses and in the intensity of stresses depending on the kind and thickness of films that have been formed on the substrate. The warped substrate S is likely to become slidable because it does not come into surface contact with the robot hand. Then, if the speed of motion of the robot is accelerated to improve the throughput, the substrate S will give rise to a positional deviation on the robot hand 3.

Conventionally, as a robot hand in which this kind of disadvantages have been eliminated, there is known one, in patent document 1, in which a plurality of pads are attached to an upper surface respectively through spring members. According to this arrangement, even if the substrate gives rise to warping into convex or concave shape, each of the pads will be displaced to follow the warping, whereby the pads come into surface contact with the substrate. As a result, the frictional resistance between the pads and the substrate becomes equivalent to that when the substrate is flat, and the positional deviation of the substrate will thus be suppressed.

Patent Document 1: JP-A-2002-353291

However, in the above-mentioned arrangement described in the patent document 1, it becomes necessary to mount a large number of spring members on the robot hand, thereby bringing about an increase in cost. Further, the spring members are vibrated when the robot hand has come to a stop after movement, and if the substrate is handed over during the vibration, the substrate will be deviated in position. Therefore, it becomes necessary to wait for the vibration to stop before the substrate can be handed over. This will be an obstacle to an attempt in improving the throughput. In addition, if the robot hand is not held in a horizontal posture at the time of handing over, nonuniform load will be applied to the plurality of springs, resulting in a disadvantage in that the substrate will be deviated in a certain direction.

DISCLOSURE OF THE INVENTION

Problems to be Solved by the Invention

In view of the above-mentioned points, this invention has a problem to provide a robot hand for transferring a substrate in which the robot hand is capable of stably supporting the substrate without using spring members and the like even if the substrate gives rise to warping.

Means for Solving the Problems

In order to solve the above-mentioned problems, according to a first embodiment of this invention, there is provided a robot hand for substrate transfer in which the robot hand is disposed on a substrate transfer robot to support a substrate in a state of being placed on the robot hand. A first seating surface on which a lower-surface peripheral portion of the substrate is seated is provided on an upper surface of the robot hand, and the first seating surface has an upward step formed on a periphery thereof. A second seating surface which is inclined downward toward a center of the substrate is provided on an upper surface portion, away from the peripheral portion of the substrate, of the robot hand such that the lower surface of the substrate is seated on the second seating surface when the substrate is warped downward into a concave shape.

According to the first embodiment, in case the substrate is flat or warped upward into a convex shape, the lower-surface peripheral edge of the substrate gets seated on the first seating surface. And the outer peripheral edge of the substrate comes into contact with the step along the periphery of the first seating surface, whereby the substrate can be prevented from positionally deviating. On the other hand, in case the substrate is warped downward into a concave shape, the peripheral edge of the substrate comes into contact with the step along the periphery of the first seating surface in a state of being upwardly inclined. Therefore, there is a possibility that the peripheral edge of the substrate will get over the step due to an inertia force at the time of stopping the movement of the robot hand. In the first embodiment, however, in case the substrate is warped downward into a concave shape, the lower surface of the substrate gets seated onto the second seating surface. As a result, due to a frictional resistance of the second seating surface, the positional deviation of the substrate can be suppressed.

As described above, according to the first embodiment of this invention, whichever of the convex warping and concave warping may happen to the substrate, the substrate can be stably supported without giving rise to positional deviation. In addition, unlike the above-mentioned prior art, there is no need of providing the robot hand with springs and the like. Therefore, an attempt can be made to reduce the cost, and also the substrate can be immediately handed over right after the stopping of movement of the robot hand, thereby contributing to the improvement in the throughput.

By the way, if the step along the periphery of the first seating surface is formed vertically, there is the following disadvantage, i.e., should the substrate be positionally deviated even slightly when the substrate is received with the robot hand, the lower-surface peripheral portion of the substrate will be mounted on top of the step and, therefore, will not be seated into contact with the first seating surface. On the other hand, by forming the step in an inclined manner so as to obtain an aligning effect, even if the substrate is slightly deviated, the positional deviation is corrected, and the lower-surface peripheral portion of the substrate can be seated into contact with the first seating surface. In this case, if the step is simply provided with an inclination, there is a possibility that the peripheral edge of the substrate will get over the step at a stretch due to an inertia force at the time of stopping the movement of the robot hand.

As a solution, according to the first embodiment of this invention, it is preferable to provide the upward step along the periphery of the first seating surface with a plurality of stages in the shape of stairs. According to this arrangement, even if the peripheral edge of the substrate may get over a lower stage, the force will be reduced by the contact of the substrate with the next upper stage. In this manner, the peripheral edge of the substrate can be effectively prevented from getting over the step by an inertia force.

In the film-forming processing to the substrate, there is a case in which the film is also formed by wrapping around the peripheral edge of the substrate. In this case, the film on the peripheral edge of the substrate will get scratched by the above-mentioned stair-shaped stage to thereby become a source of dust generation. As a solution, according to the first embodiment of this invention, preferably, those portions of the stages which come into contact with the peripheral edge of the substrate are formed into rounded surfaces.

In addition, in order to solve the above-mentioned problems, according to a second embodiment of this invention, there is provided a robot hand for substrate transfer in which the robot hand is disposed on a substrate transfer robot to support a substrate in a state of being placed on the robot hand. The robot hand has on an upper surface thereof an upwardly raised band (or projected strip) which is elongated in a band shape along the same circle of a predetermined diameter that is smaller than an outside diameter of the substrate, and an upper surface of the raised band is formed into a curved surface with a downward inclination toward both a diametrically outer side and a diametrically inner side.

According to the second embodiment, in case the substrate is warped upward into a convex shape, the lower surface of the substrate comes into linear contact with the curved surface on a diametrically outer side of the raised band. On the other hand, in case the substrate is warped downward into a concave shape, the lower surface of the substrate will come into linear contact with the curved surface on the diametrically inner side of the upper surface of the raised band. Therefore, whichever of the concave shape and the convex shape of warping may happen to the substrate, the substrate can be stably supported without positional deviation of the substrate.

By the way, in the course of film-forming processing to the substrate, there is a case where a film may be formed by wrapping around to the lower-surface peripheral portion of the substrate. As a result, when the lower-surface peripheral portion of the substrate gets seated on the raised band, there is a possibility that the film at the lower-surface peripheral portion of the substrate will be scratched and peeled off. If there exists a peeled-off film between the upper surface of the raised band and the substrate, this film will serve the purpose of a roller, whereby the friction force will extremely be lowered and the positional deviation of the substrate becomes easier to takes place.

As a solution, in the second embodiment, preferably the predetermined diameter is set such that the substrate is seated on the raised band at a diametrically inner portion than a lower-surface peripheral portion of the substrate where a film is possibly formed by wrapping around of the film in a film-forming processing to the substrate. According to this arrangement, the film on the lower-surface peripheral portion of the substrate will not be peeled off by the scratching with the projected string. As a result, the above-mentioned disadvantage can be prevented.

In addition, according to the second embodiment, it becomes necessary to subject the raised band to the work of polishing the curved surface on the diametrically outer side and the curved surface on the diametrically inner side, respectively, of the upper surface of the raised band. And the curved surface on the diametrically outer side and the curved surface on the diametrically inner side meet each other at the diametrically intermediate portion of the upper surface of the raised band to thereby form a ridge line. Once this kind of ridge line is formed, scratches are likely to be formed on the lower surface of the substrate. On the other hand, if a diametrically intermediate portion of the upper surface of the raised band is formed into a flat surface, there will be formed no ridge line, thereby preventing the scratching on the lower surface of the substrate.

Further, in the second embodiment, in case the above-mentioned raised band is formed separately into a plurality of portions along the circle, the edge to be formed by the end surface and the upper surface of each raised band comes into point-contact with the lower surface of the substrate, should the robot hand be warped or the like reason. The lower surface of the substrate will thus be scratched. As a solution, if end surfaces of respective raised bands are formed into inclined surfaces, the angle to be formed by the end surfaces and the upper surface of each of the raised bands will be an obtuse angle, whereby scratches are hardly formed on the lower surface of the substrate.

BEST MODE FOR CARRYING OUT THE INVENTION

A description will now be made of an embodiment in which this invention is applied to a robot hand 3 to be connected to a robot arm 2 of a transfer robot 1 as shown in FIG. 1. In other words, the transfer robot 1 is disposed, like in the above-mentioned prior art, in a transfer chamber A. To a front end of the robot arm 2 there is attached, as shown in FIG. 2, a robot hand 3 according to a first embodiment through a gear box 2a.

Since there is a case in which a substrate S is heated to a high temperature in a processing chamber C, this robot hand 3 has heat resisting properties and, in addition, is formed of a material having a high coefficient of friction such as a plate material, e.g., of $Al_2O_3$, $SiO_2$, SiC and the like. Further, the robot hand 3 is provided with a pair of finger portions 5 which are bifurcated at, and are elongated forward from, a base end portion 4 that is connected to the gear box 2a.

At the base end portion 4 and at a front end portion of each of the finger portions 5, there is provided a first seating surface 6 on which a lower-surface peripheral portion of the substrate S can be seated at three circumferential positions thereof (see FIG. 3). On the inner circumference of the first seating surface 6, there is formed a downward step 7. It is ordinarily so arranged that the lower surface of the substrate S other than the peripheral portion is kept out of contact with the robot hand 3.

Further, on the periphery of the first seating surface 6 there is formed an upward step 8. According to this arrangement, even if an inertia force is operated on the substrate S at the time of stopping the movement of the robot hand 3, the peripheral edge of the substrate S comes into contact with the step 8, whereby the substrate S can be prevented from positionally deviating relative to the robot hand 3.

By the way, in case the step 8 on the periphery of the first seating surface 6 is formed vertically, at the time of receiving the substrate S by the robot hand 3, the lower-surface peripheral portion of the substrate S will overlap with (sit on top of) the step 8 if the substrate S is positionally deviated even slightly. This will result in a failure for the substrate S to get seated on the first seating surface 6. Therefore, it is desired to provide the step 8 with an inclination so that an aligning function to correct the positional deviation of the substrate S can be obtained. In this case, if the step 8 is simply provided with an inclination, there is a possibility that the peripheral edge of the substrate S will get over the step 8 at a stretch due to the inertia force at the time of stopping the movement of the robot hand 3. As a solution, the step 8 is provided with a plurality of stages 8a, 8b, 8c in the form of stairs. According to this arrangement, even if the peripheral edge of the substrate S has got over the lower stage 8a, the momentum will be decreased by the contact of the substrate with the next upper stage 8b. In this manner, the peripheral edge of the substrate S can be effectively prevented from getting over the step 8 due to its inertia force.

Here, in case the substrate S is flat or warped into an upwardly convex shape, the substrate S can be prevented by the step 8 from positionally deviating, as described above. However, in case the substrate S is warped into a downwardly concave shape as shown by an imaginary line in FIG. 3, the peripheral edge of the substrate S will come into contact with the step 8 of the periphery of the first seating surface 6 in an upwardly inclined state. As a result, when the robot hand 3 is operated at a high speed, there is a possibility that the peripheral edge of the substrate S will get over the step 8 due to the inertia force at the time of stopping the movement of the robot hand 3.

Therefore, on an upper surface of the inner edge portion at the branched position of the finger portions 5, 5, i.e., at that portion of the robot hand 3 which is away from the peripheral portion of the substrate S, there is provided a second seating surface 9 which is downwardly inclined toward the center of the substrate S. According to this arrangement, in case warping into the concave shape has occurred to the substrate S, the lower surface of the substrate S will be seated on the second seating surface 9. As a result, the frictional resistance due to the second seating surface 9 suppresses the positional deviation of the substrate S.

As described hereinabove, according to the first embodiment, even in case the substrate S may give rise to warping of any of the convex shape and concave shape, the substrate S can be stably supported by the robot hand 3 in a manner not to positionally deviate. As a result, the moving speed of the substrate transfer robot 1 can be accelerated to improve the throughput. In addition, unlike the above-mentioned conventional art, there is no need of providing the robot hand with spring members and the like. Therefore, an attempt can be made to reduce the cost. Further, unlike the above-mentioned prior art, there is no need for the robot hand 3, when stopped after having moved, to wait for the vibrations of the spring members to be damped. Instead, the substrate S can immediately be transferred. An attempt for further improving the throughput can therefore be made.

In the first embodiment, the second seating surface 9 is formed integrally with the robot hand 3. It is, however, also possible to form the second seating surface 9 by adhering to the robot hand 3 a material which has a large coefficient of friction such as rubber and the like. Still furthermore, as shown in FIG. 4, those portions of each of the stages 8a, 8b, 8c which come into contact with the peripheral edge of the substrate S, may be formed into rounded surfaces 8d. According to this arrangement, if the film is formed in the film-forming processing by wrapping around the peripheral edge of the substrate S, the film on the peripheral edge of the substrate S can be prevented from getting peeled off due to scratching.

With reference to FIGS. 5 through 7, a description will now be made of a robot hand 30 according to a second embodiment of this invention. The robot hand 30 which is mounted on a front end of the robot arm 2 through a gear box 2a is formed, in the same manner as in the above-mentioned first embodiment, of a material having heat resisting properties and, in addition, having a high coefficient of friction. The robot hand is provided with a base end portion 31 which is connected to a gear box 2a, and a pair of finger portions 32, 32 which are bifurcated from the base end portion 31 so as to be elongated forward.

On an upper surface of the robot hand 30, there is provided an upwardly raised band (projected strip) 33 which is elongated in a band shape along the same circle C of a predetermined diameter that is smaller than an outside diameter of the substrate S. It is thus so arranged that the substrate S can be seated on the raised band 33 coaxially with the circle C. The raised band 33 is provided separately in a plurality of portions on the circle C, i.e., separately in three portions at the base end portion 31, and at a pair of finger portions 32, 32. In this embodiment, the raised band 33 is formed integrally with the robot hand 30. Alternatively, the raised band 33 may be formed of rubber and the like into a body separate from the robot hand 30, and the raised band 33 may then be mounted on the upper surface of the robot hand 30. Considering the heat resisting properties, however, it is desirable to integrally form, like in this second embodiment, the raised band 33 on the robot hand 30.

By the way, in the film-forming processing on the substrate S, there are cases where a film is formed to the lower-surface peripheral portion of the substrate S as a result of wrapping around of the film Sa as shown in FIG. 6. Therefore, when the lower-surface peripheral portion of the substrate S is seated on the raised band 33, there is a possibility that the film Sa on the lower-surface peripheral portion of the substrate S is scratched and peeled off. When the peeled film is present between the upper surface of the raised band 33 and the substrate S, this film will serve the purpose of a roller, so that the friction force will be extremely lowered, whereby positional deviation of the substrate S easily takes place.

As a solution, in this embodiment, the diameter of the above-mentioned circle C is set such that the lower-surface portion of the substrate S which is diametrically inner side than the lower-surface peripheral portion of the substrate S is seated on the raised band 33, the peripheral portion being defined as the portion which is likely to be formed with a film by winding around of the film Sa in the film-forming process. According to this arrangement, there is no possibility that the film Sa on the lower-surface peripheral portion of the substrate S is scratched and peeled off by the raised band 33. The above-mentioned disadvantage can thus be prevented.

Further, in this embodiment, the upper surface of the raised band 33 is formed, as shown in FIG. 6, into a curved surface 33a which is inclined downward toward the diametrically outer side and toward the diametrically inner side, respectively. According to this arrangement, in case the substrate S is warped upward into a convex shape as shown by a solid line in FIG. 6, the lower surface of the substrate S will come into liner contact with the curved surface 33a on the diametrically outer side on the upper surface of the raised band 33. On the other hand, in case the substrate S is warped downward into a concave shape as shown by an imaginary line in FIG. 6, the lower surface of the substrate S will come into linear contact with the curved surface 33a on the diametrically inner side on the upper surface of the raised band 33. It means that, whichever warping of concave shape and convex shape may occur with the substrate S, the substrate S can be stably supported so as not to be positionally deviated. It is to be noted that the flat substrate S may also be deflected downward into a concave shape due to its own weight and therefore that the lower surface of the substrate S will come into linear contact with the curved surface 33a on the diametrically inner side of the upper surface of the raised band 33. The substrate S will thus be stably supported.

By the way, when the raised band 33 is integrally formed on the robot hand 30, it becomes necessary to finish-grind, from the diametrically outer side and from the diametrically inner side, the curved surface 33a on the diametrically outer side and the curved surface 33a on the diametrically inner side, respectively, of the upper surface of the raised band 33. At this time, there is a possibility that a flat surface will remain at a diametrically intermediate portion on the upper surface of the raised band 33 or that a ridge line will be formed as a result of crossing of the diametrically outer curved surface 33a and the diametrically inner curved surface 33a at a diametrically intermediate portion on the upper surface of the raised band 33. Once this kind of ridge line is formed, the lower surface of the substrate S is easily scratched. As a solution, in this embodiment, the curved surface 33a is arranged to be ground such that a slight flat surface 33b remains at a diametrically intermediate portion of the upper surface of the raised band 33. According to this arrangement, there will be formed no ridge line, thereby preventing the substrate from getting scratched.

In addition, according to this embodiment, the end surface of the raised bands 33 provided by separating them into the base end portion 31, and a pair of finger portions 32, 32, are respectively formed into inclined surfaces 33c as shown in FIG. 7. In case the robot hand 30 is warped as shown by an imaginary line in FIG. 7, the edge to be formed by the end surface and the upper surface of each of the raised bands 33 will come into point contact with the lower surface of the substrate S, thereby giving rise to the possibility of scratching the lower surface of the substrate S. However, if the end surface of each of the raised bands 33 is formed in inclined surface 33c, the angle to be formed by the end surface and the upper surface of each of the raised bands 33 will form an obtuse angle, so that the lower surface of the substrate S is hardly scratched. The inclined surfaces 33c may alternatively be formed into curved surfaces.

In the second embodiment the robot hand 30 is not provided with the step 8 according to the first embodiment. However, this kind of step may also be formed in the robot hand 30.

DESCRIPTION OF REFERENCE NUMERALS AND CHARACTERS

Figure 1:
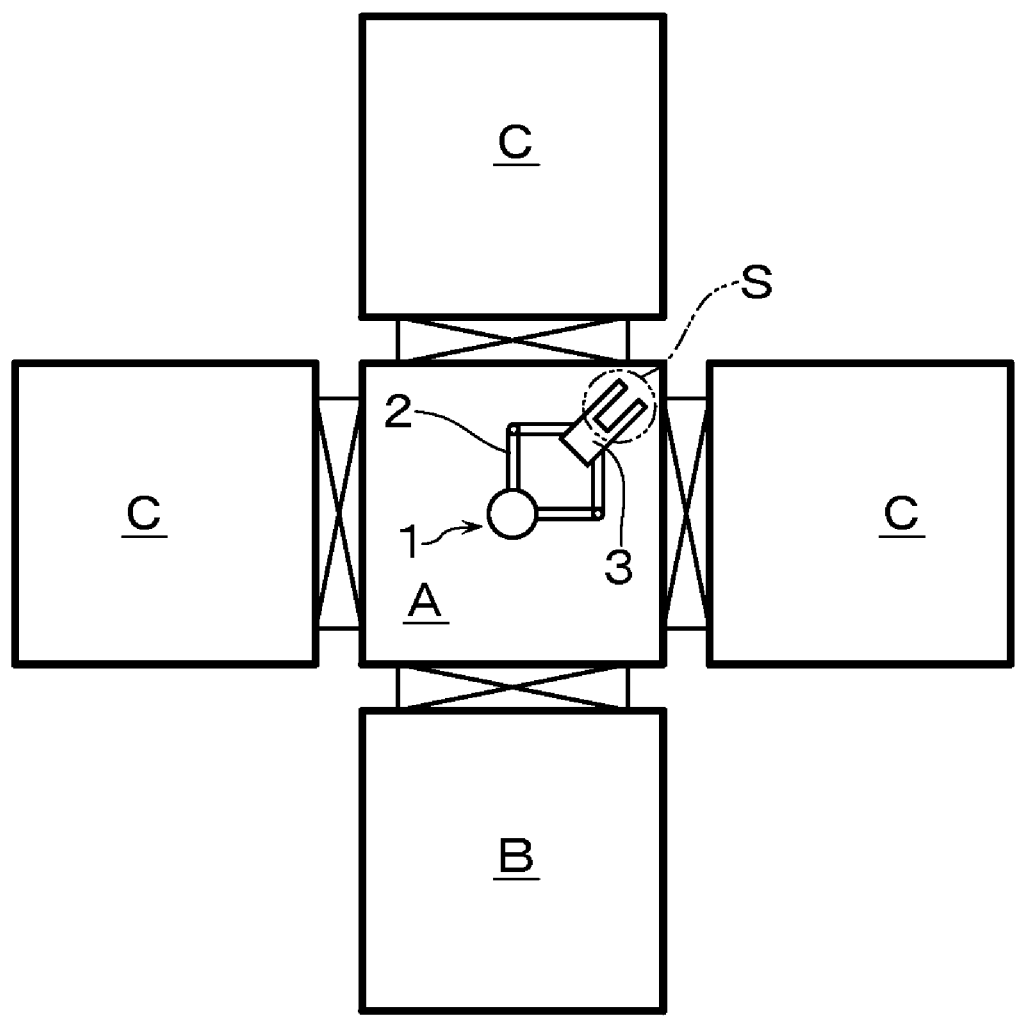
FIG. 1 is a schematic plan view showing a substrate processing apparatus provided with a transfer robot.
Figure 2:
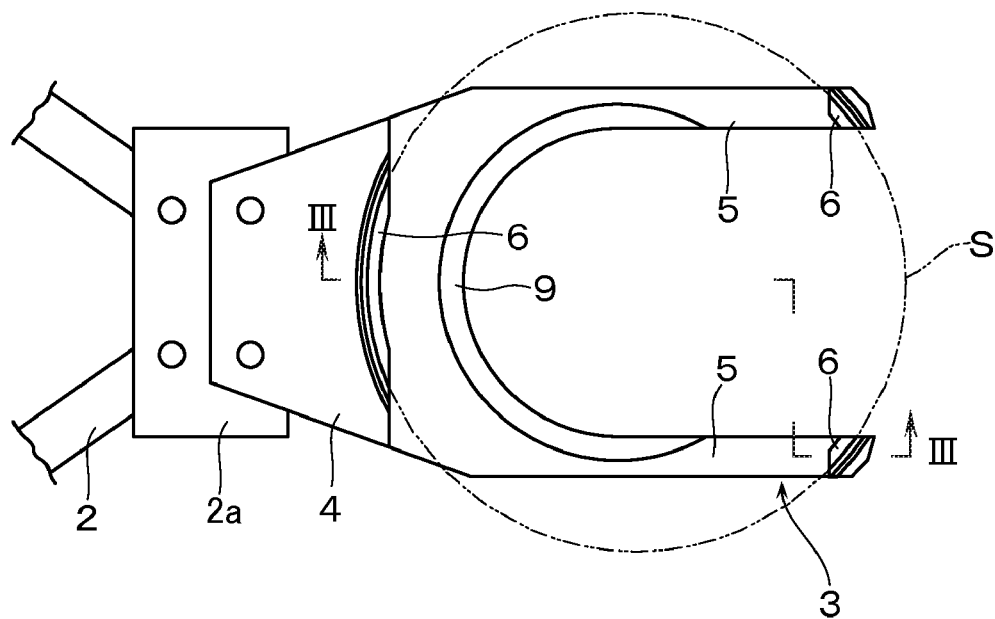
FIG. 2 is a plan view showing a robot hand according to the first embodiment of this invention.
Figure 3:
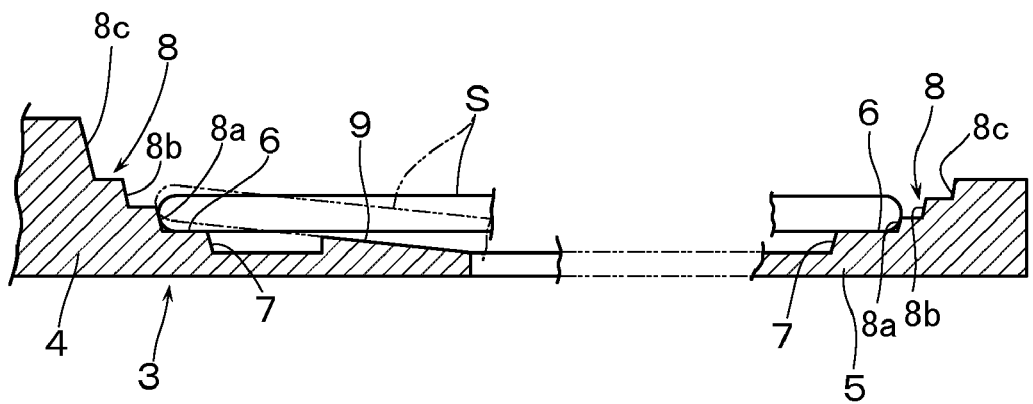
FIG. 3 is an enlarged sectional view taken along the line III-III in FIG. 2.
Figure 4:
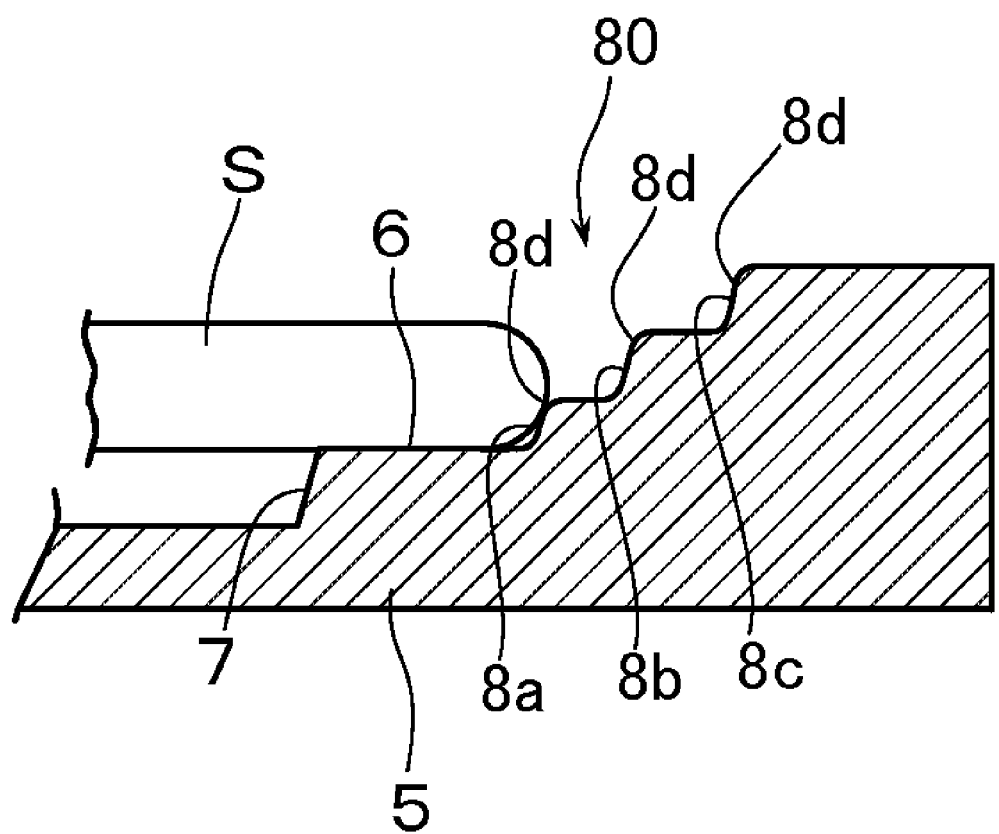
FIG. 4 is an enlarged sectional view of an essential part of a modified example of robot hand according to the first embodiment of this invention.
Figure 5:
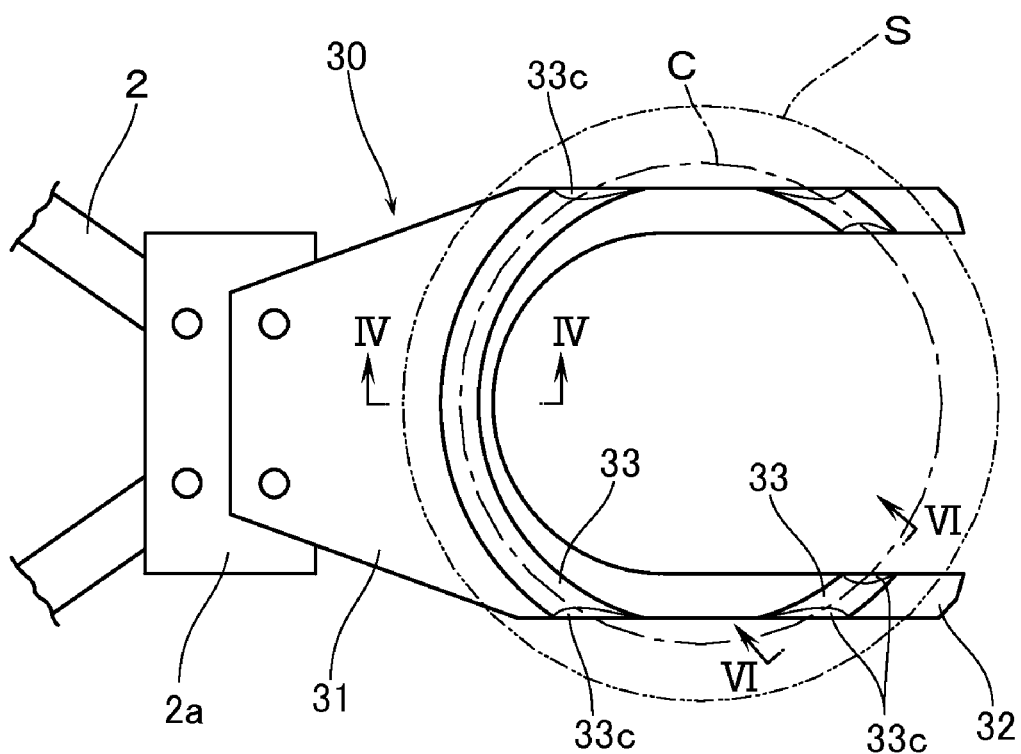
FIG. 5 is a plan view showing a robot hand according to the second embodiment of this invention.
Figure 6:
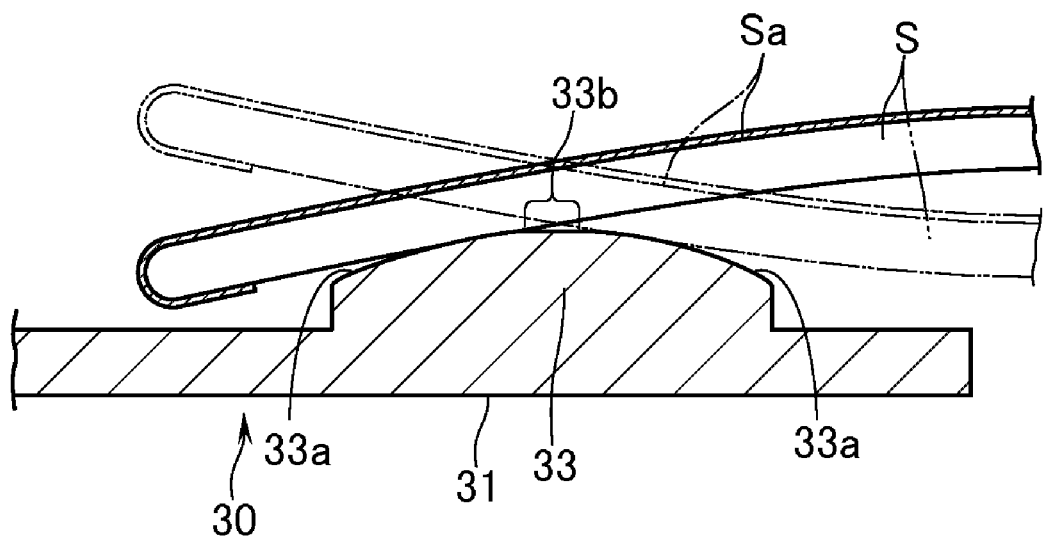
FIG. 6 is an enlarged sectional view taken along the line IV-IV in FIG. 5.
Figure 7:
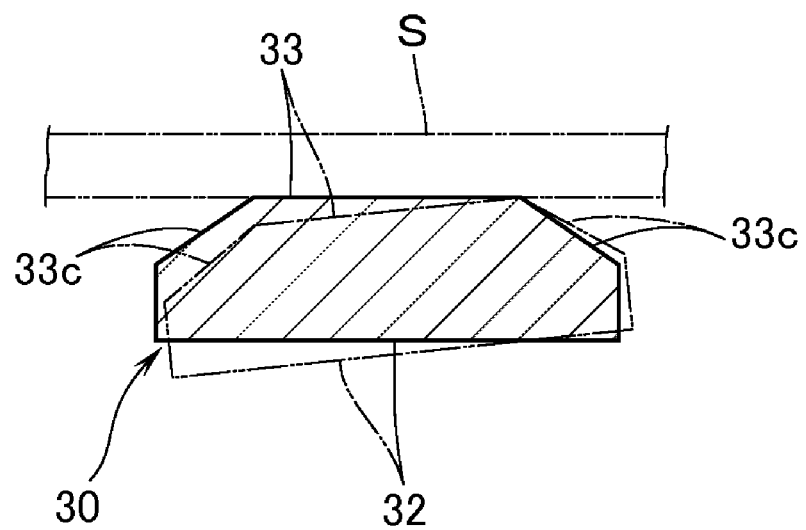
FIG. 7 is an enlarged sectional view taken along the line VI-VI in FIG. 5.

S substrate
Sa film
3, 30 robot hand
6 first seating surface
8 step
8a, 8b, 8c stage
8d rounded surface
9 second seating surface
33 raised band
33a curved surface
33b flat surface
33c inclined surface

What is claimed is:

1. A robot hand for substrate transfer in which the robot hand is disposed on a substrate transfer robot to support a substrate in a state of being placed on the robot hand,
   wherein a first seating surface on which a lower-surface peripheral portion of the substrate is seated is provided on an upper surface of the robot hand, and the first seating surface has an upward step formed on a periphery thereof, and
   wherein a second seating surface which is inclined downward toward a center of the substrate is provided on an upper surface portion, away from the peripheral portion of the substrate, of the robot hand such that the lower surface of the substrate is seated on the second seating surface when the substrate is warped downward into a concave shape.

2. The robot hand for substrate transfer according to claim 1, wherein the step is provided with a plurality of stair-shaped stages.

3. The robot hand for substrate transfer according to claim 2, wherein those portions of the stages which come into contact with a peripheral edge of the substrate are formed into rounded surfaces.

* * * * *